United States Patent
Mei et al.

(10) Patent No.: US 9,559,086 B2
(45) Date of Patent: Jan. 31, 2017

(54) SEMICONDUCTOR DEVICE WITH MODIFIED CURRENT DISTRIBUTION

(71) Applicant: Micron Technology, Inc., Boise, ID (US)

(72) Inventors: Shizhong Mei, Boise, ID (US); Victor Wong, Boise, ID (US); Jeffrey P. Wright, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/726,005

(22) Filed: May 29, 2015

(65) Prior Publication Data

US 2016/0351551 A1 Dec. 1, 2016

(51) Int. Cl.
| | | |
|---|---|---|
| H01L 25/18 | (2006.01) | |
| H01L 23/48 | (2006.01) | |
| H01L 25/00 | (2006.01) | |
| H01L 23/00 | (2006.01) | |
| H01L 23/538 | (2006.01) | |

(52) U.S. Cl.
CPC .......... *H01L 25/18* (2013.01); *H01L 23/481* (2013.01); *H01L 24/18* (2013.01); *H01L 25/50* (2013.01); *H01L 23/5384* (2013.01)

(58) Field of Classification Search
None
See application file for complete search history.

(56) References Cited

U.S. PATENT DOCUMENTS

| | | | | |
|---|---|---|---|---|
| 8,735,285 | B2* | 5/2014 | Sandhu | H01L 21/32139 257/E21.582 |
| 9,054,101 | B2* | 6/2015 | Semmelmeyer | H01L 25/0652 |
| 9,287,257 | B2* | 3/2016 | Chao | H01L 23/5283 |
| 2007/0023887 | A1* | 2/2007 | Matsui | H01L 24/73 257/686 |

(Continued)

FOREIGN PATENT DOCUMENTS

WO 2014015316 A2 1/2014

OTHER PUBLICATIONS

Distributed TSV Topology for 3-D Power-Supply Networks, by Michael B. Healy and Sung Kyu Lim, IEEE Transactions on Very Large Scale Integration (VLSI) Systems, vol. 20, No. 11, Nov. 2012, 14 pp.

(Continued)

*Primary Examiner* — Andres Munoz
(74) *Attorney, Agent, or Firm* — Brooks, Cameron & Huebsch, PLLC (57) ABSTRACT

Semiconductor devices having modified current distribution and methods of forming the same are described herein. As an example, a memory die in contact with a logic die can be configured to draw a sum amount of current from a current source. The memory die can include a plurality of through-substrate vias (TSVs) formed in the memory die and configured to provide the sum amount of current to the memory die from the current source. The memory die can include at least two interconnection contacts associated with a first TSV closer to the current source that are not connected. The memory die can include an electrical connection between at least two interconnection contacts associated with a second TSV that is further in distance from the current source than the first TSV.

30 Claims, 3 Drawing Sheets

(56) References Cited

U.S. PATENT DOCUMENTS

| | | | |
|---|---|---|---|
| 2010/0270668 A1* | 10/2010 | Marcoux | H01L 23/481 257/690 |
| 2011/0109381 A1 | 5/2011 | Foster et al. | |
| 2011/0193199 A1 | 8/2011 | Filippi et al. | |
| 2011/0291289 A1 | 12/2011 | Yoon et al. | |
| 2012/0199983 A1 | 8/2012 | Farooq et al. | |
| 2012/0267790 A1 | 10/2012 | Lee et al. | |
| 2013/0277855 A1* | 10/2013 | Kang | H01L 23/49816 257/774 |
| 2014/0022002 A1* | 1/2014 | Chua-Eoan | G07F 17/326 327/512 |
| 2014/0048907 A1 | 2/2014 | Yoon et al. | |
| 2014/0134798 A1* | 5/2014 | Kim | H01L 24/19 438/109 |
| 2015/0171090 A1* | 6/2015 | Sandhu | H01L 21/32139 438/586 |

OTHER PUBLICATIONS

Power Distribution in TSV-Based 3-D Process-Memory Stacks, by Suhas M. Satheesh and Emre Salman, IEEE Journal on Emerging and Selected Topics in Circuits and Systems, vol. 2, No. 4, Dec. 2012, 12 pp.

International Search Report and Written Opinion from related international application No. PCT/US2016/033413, dated Jul. 29, 2016, 10 pp.

* cited by examiner

SEMICONDUCTOR DEVICE WITH MODIFIED CURRENT DISTRIBUTION

TECHNICAL FIELD

The present disclosure relates generally to semiconductor devices with modified current distribution and methods of forming the same.

BACKGROUND

Semiconductor devices can be used in a variety of electronic applications, such as personal computers, cell phones, digital cameras, and other electronic devices. Various semiconductor devices, e.g., memory dies, utilize through-substrate-vias (TSVs), which are conductive vias that can provide electrical continuity through a semiconductor device, such as a silicon wafer or die, for instance. TSVs can enable two or more integrated circuit (IC) devices to be stacked vertically into a three-dimensional (3D) chip stack. For example, the TSVs of an IC device at a top of a stack can connect to the TSVs of an IC device lower in the stack. By electrically connecting the IC devices in a stack, the TSVs can enable the IC devices in the stack to function as a single device. TSV technology can enable a 3D chip stack to have increased connectivity, bandwidth, and/or functionality, yet occupy a small footprint area, among other benefits. Still, connecting 3D chip stacks to provide adequate power and wear longevity poses challenges.

DETAILED DESCRIPTION

Semiconductor devices having a modified current distribution and methods of forming the same are described herein. For instance, a memory die can be on top of and in contact with a logic die. The memory die can be configured to draw an amount of current from a current source. The memory die can include a plurality of through substrate vias (TSVs) (e.g., through silicon vias) formed in the memory die and configured to provide the amount of current to the memory die from the current source. The memory die can include at least two interconnection contacts associated with a first TSV closer to the current source that are not connected. The memory die can include an electrical connection between at least two interconnection contacts associated with a second TSV a further physical distance from the current source than the first TSV.

TSVs may be formed in semiconductor devices by a variety of processes. As an example, a photoresist can be applied to a surface, e.g. frontside surface of a semiconductor wafer. Thereafter, the wafer can be patterned and an etching process, such as a deep reactive-ion etching process, can be utilized to create vias in the patterned wafer. The wafer, which may be referred to as a substrate, can include a number of semiconductor based structures that can include silicon, silicon-on-insulator (SOI), silicon-on-sapphire, silicon germanium, gallium-arsenide, among others. For various applications, a number of materials may be formed in the vias. For instance, a liner material, such as an oxide, and a barrier material, such as a tantalum for instance, can be formed in the vias. The vias can be filled with a conductive material, such as copper, tungsten, or aluminum, for instance. At this stage the filled vias may not extend completely through the wafer. As such, the wafer can be flipped and backside processing can occur. For instance, a thinning and/or TSV reveal process can be performed resulting in the conductive material within the vias extending all the way through the wafer.

After formation of the TSVs, e.g., after the vias extend through the wafer, a number of further processing steps can be performed for various applications. For instance, a conductive line can be formed to connect a TSV in order to facilitate connection, e.g., physical and/or electrical, of the semiconductor device to a number of other semiconductor devices and/or other components of an electronic device (e.g., on-die circuitry, interconnection contacts such as metallization layers, etc.). A width of the conductive line can vary in accordance with a number of examples of the present disclosure. For example, a distance of a TSV associated with the conductive line from a current source can determine a width of the interconnect. In some examples, a conductive line associated with a TSV closer in distance to a current source can be narrower than a conductive line associated with a TSV further, distancewise, from the current source.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 127 may reference element "27" in FIG. 1, and a similar element may be referenced as 227 in FIG. 2. Also, as used herein, "a number of" a particular element and/or feature can refer to one or more of such elements and/or features.

Figure 1:
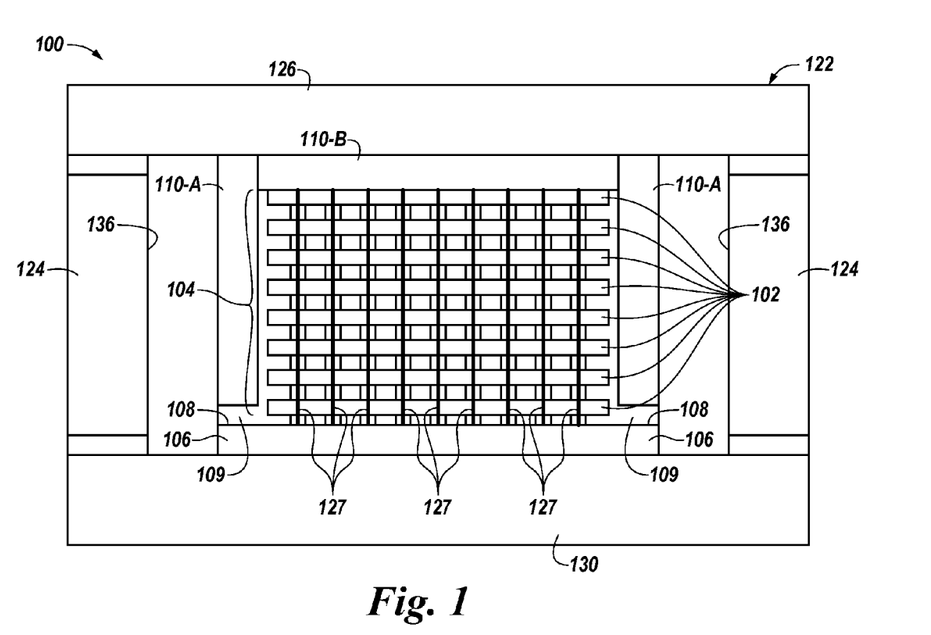
FIG. 1 is an example of a semiconductor die assembly in accordance with a number of embodiments of the present disclosure.

FIG. 1 is an example of an illustration of a semiconductor die assembly 100 in accordance with a number of embodiments of the present disclosure. A semiconductor die assembly 100 can include a hybrid memory cube (HMC). The die 106 can have a larger footprint than the dies 102 of stack 104. For instance, in this example, the die 106 includes a peripheral portion 108 extending laterally outward beyond at least one side of the stack 104. The assembly 100 can further include a first thermal transfer feature 110-A at the peripheral portion 108 of the die 106 and an optional second thermal transfer feature 110-B superimposed with the dies 102.

The first and second thermal transfer features 110-A and 110-B can thermally contact a thermally conductive casing 122 that extends at least partially around the first and second semiconductor dies 102 and 106, respectively. The casing 122 can include an outer portion 124 spaced laterally apart from the die 106 on the package substrate 130 and a cap portion 126 carried by the outer portion 124. The outer portion 124 and the cap portion 126 form a recess 136 configured such that both the vertically-extending first thermal transfer feature 110-A and the second thermal transfer feature 110-B thermally contact an underside of the cap portion 126. Although not shown in FIG. 1, the package substrate 130 can be coupled to an underlying base structure such as a printed circuit board (PCB), for example.

As an example, the assembly 100 can be configured as a hybrid memory cube (HMC) in which the dies 102 are dynamic random-access memory (DRAM) dies and/or other memory dies that provide data storage and die 106 can be a logic die that provides memory control (e.g., DRAM control) and/or other functions within the HMC. For instance, the assembly 100 can include a plurality of first semiconductor dies 102 (e.g., memory dies) arranged in a stack 104 on a second semiconductor die 106 (e.g., a high-speed logic die that provides memory control within the HMC). The semiconductor dies 102 and 106 (collectively referred to as "dies 102, 106") can include various types of semiconductor components and functional features, such as dynamic random-access memory (DRAM), static random-access memory (SRAM), flash memory, other forms of integrated circuit memory, processing circuits, imaging components, and/or other semiconductor features.

A number of through substrate vias (TSVs) 127 can be positioned along a number of dies, as illustrated in FIG. 1. That is, a number of TSVs can travel through a memory die (e.g., a memory die of semiconductor dies 102). A bottom-most memory die of the semiconductor dies 102 can include a TSV that connects with a corresponding TSV of a memory die directly above the bottom-most memory die (further illustrated in FIG. 3). The TSVs 127 can connect through each of the memory dies from a bottom-most memory die to a top-most memory die. Current traveling through each of the TSVs of a memory die of memory dies 127 can vary based on a distance from a current source.

In addition, in some examples, as each memory die is added to a stack of semiconductor dies (e.g., semiconductor dies 102), a current traveling through a first bottom-most memory die is increased. When stacking a second memory die directly above the first memory die, current can be increased through each of the TSVs of the bottom-most memory die. For example, a particular current (e.g., 9.1 mA) may be provided to pass through a first TSV closest in distance to a current source of the first memory die to supply current to on-die circuitry associated with the first memory die. A second memory die stacked on top of the first memory die may have a particular current (e.g., 9.1 mA) traveling through a first TSV of the second memory die to supply current to on-die circuitry associated with the second memory die. Therefore, a total of both particular currents (e.g., 9.1+9.1=18.2 mA) will travel through the first TSV of the first memory die to supply the particular current (e.g., 9.1 mA) to the circuitry associated with the first memory die and the particular current (e.g., 9.1 mA) to the circuitry associated with the second memory die. The first TSV of the second memory die will receive a portion of the particular current (e.g., 9.1 mA) traveling through the first TSV.

A TSV can have a particular operational longevity based on a current running through the TSV. That is, a TSV can last longer without complications and/or malfunctioning based on how much current is running through the TSV. For example, a TSV that maintains a current below a particular threshold (e.g., 13 mA) can have a longer operational lifetime than a TSV that has a current above the particular threshold.

Figure 2:
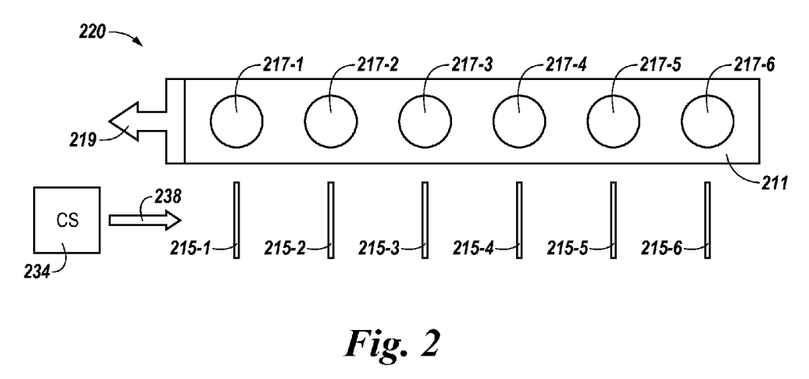
FIG. 2 is an example of providing current to TSVs to a semiconductor device.
Figure 3:
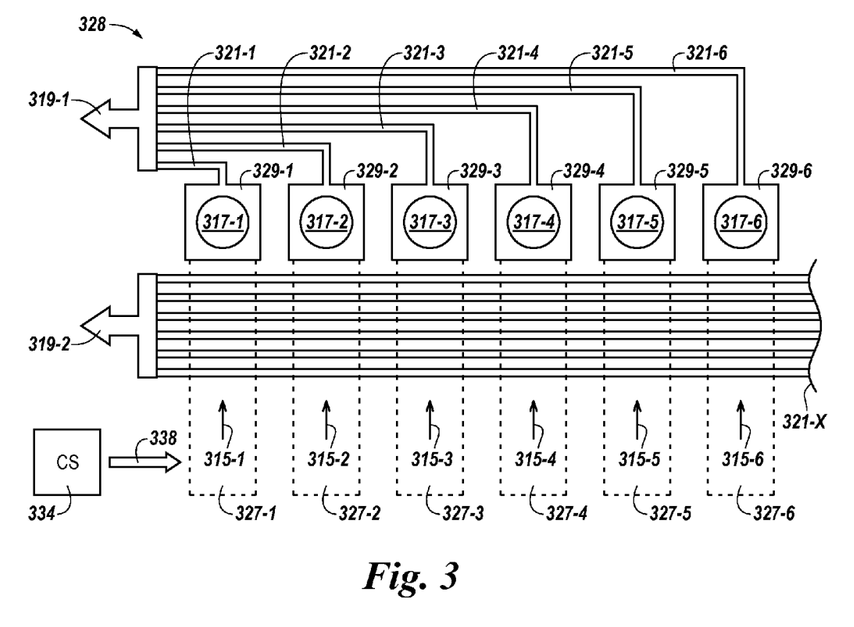
FIG. 3 is an example of a semiconductor device in accordance with a number of embodiments of the present disclosure.

FIG. 2 is an example of an illustration of a semiconductor device 220 in accordance with a number of embodiments of the present disclosure. The semiconductor device 220 can include a power bus 211 that provides current, at 219, to on-die circuitry of a memory die. The power bus 211 can be coupled to a number of electrical connections (e.g., metallization bumps such as solder bumps, etc.) 217-1 to 217-6. The number of electrical connections 217-1 to 217-6 can each be coupled to a number of TSVs (illustrated in FIG. 3 as TSVs 327-1 to 327-6). A sum of an amount of current 238 can be provided in a number of current portions 215-1 to 215-6 associated with a number of corresponding TSVs (e.g., TSVs 327-1 to 327-6, as illustrated in FIG. 3). Current 215-1 to 215-6 can be supplied, illustrated at 238, by a current source 234 to the power bus 211 through the number of TSVs. The current source 234, for example, can be current provided by a computer processing unit (CPU), memory controller, etc.

An amount of current from the current source 234 can be distributed across TSVs. That is, each of currents 215-1 to 215-6 can be a portion of a total current 238 being provided to on-die circuitry by the current source 234. Current reaching each TSV can be based on a physical distance of the TSV from the current source 234. That is, in previous examples, current 215-1 can be greater than current 215-2 since current 215-1 is traveling through a TSV physically closer to the current source 234. For example, current 215-1 associated with a first TSV closest to the current source 234 may be 24 mA. Current 215-2 associated with a second TSV second closest to the current source 234 may be 4.8 mA. Current 215-3 associated with a third TSV third closest to the current source 234 may be 0.9 mA. Current 215-4 associated with a fourth TSV fourth closest to the current 234 may be 0.3 mA. Current 215-5 and 215-6 associated with a fifth and sixth TSV, respectively, may have zero and/or negligible current. In this example, the current reaching the six TSVs shown by currents 215-1 to 215-6 may sum to a total current of 30 mA, in this example. However, current magnitude reaching each TSV are markedly different the farther a given TSV is from the current source 234.

A larger current magnitude through a TSV may decrease an operational lifetime of the TSV more markedly if the current exceeds a threshold. For example, when an example threshold current of 13 mA is exceeded by a TSV, the operational lifetime of the TSV can decrease at a greater rate. Hence, it can be beneficial to maintain a current through a TSV below this threshold to extend the operational lifetime of the TSV by distributing current across TSVs to maintain a current through each TSV below the threshold current.

FIG. 3 is an example of an illustration of a semiconductor device 328 in accordance with a number of embodiments of the present disclosure. The semiconductor device 328 includes a current source 334 providing current, illustrated as a total amount of current at 338, to a number of TSVs 327-1 to 327-6. A total amount of current 338 provided to the TSVs 327-1 to 327-6 includes a portion of current 315-1 of the total amount of current 338 provided to TSV 327-1. A portion of current 315-2 is provided to TSV 327-2, a portion of current 315-3 is provided to TSV 327-3, a portion of current 315-4 is provided to TSV 327-4, a portion of current 315-5 is provided to TSV 327-5, and a portion of current 215-6 is provided to TSV 327-6.

The current 315-1 to 315-6 of each respective TSV 327-1 to 327-6 is transferred to a number of interconnection contacts (e.g., conductive layers, metallization layers, etc.) 329-1 to 329-6. That is, current 315-1 is transferred to interconnection contact 329-1, current 315-2 is transferred to interconnection contact 329-2, current 315-3 is transferred to interconnection contact 329-3, current 315-4 is transferred to interconnection contact 329-4, current 315-5 is transferred to interconnection contact 329-5, and current 315-6 is transferred to interconnection contact 329-6. The interconnection contacts 329-1 to 329-6 are coupled through conductive lines 321-1 to 321-6 to on-die circuitry, illustrated at 319-1. That is, interconnection contact 329-1 is coupled to conductive line 321-1, interconnection contact 329-2 is coupled to conductive line 321-2, interconnection contact 329-3 is coupled to conductive line 321-3, interconnection contact 329-4 is coupled to conductive line 321-4, interconnection contact 329-5 is coupled to conductive line 321-5, and interconnection contact 329-6 is coupled to conductive line 321-6. In some examples, conductive line 321-1 can have a length of 10 μm and a width of 1 μm, conductive line 321-2 can have a length of 40 μm and a width of 4 μm, conductive line 321-3 can have a length of 80 μm and a width of 8 μm, conductive line 321-4 can have a length of 120 μm and a width of 12 μm, conductive line 321-5 can have a length of 160 μm and a width of 16 μm, and conductive line 321-6 can have a width of length of 200 μm and a width of 20 μm.

Current from additional TSVs 321-X are provided to on-die circuitry, illustrated at 319-2. The TSVs 327-1 to 327-6 of a memory die of semiconductor device 328 are coupled to additional memory dies (not illustrated in FIG. 3 but illustrated in FIG. 4) stacked on the memory die through a number of electrical connections (e.g., metallization bumps, solder bumps, etc.) 317-1 to 317-6. For example, electrical connection 317-1 (e.g., electrical connection 417-1) is electrically connected to a corresponding TSV (e.g., TSV 427-7) of an above stacked die (e.g., DIE 2 425-2). Likewise, each of electrical connections 317-2 to 317-6 are electrically connected to corresponding TSVs (e.g., TSVs 427-8 to 427-12) of the above stacked die (e.g., DIE 2 425-2).

TSV 327-1 can be a closest (e.g., closest by physical distance) TSV to current source 234. TSV 327-2 can be a second closest TSV to current source 334, TSV 327-3 can be a third closest, TSV 327-4 can be a fourth closest, TSV 327-5 can be a fifth closest, and TSV 327-6 can be a sixth closest. A width of a conductive line (e.g., one of conductive lines 321-1 to 321-6) can be based on a proximity (e.g., physical distance) of an associated TSV from a current source 234. For example, TSV 327-1 can be a closest TSV to current source 234. TSV 327-1 can be associated with interconnection contact 329-1 and conductive line 321-1. Conductive line 321-1 can have a different width than conductive lines 321-2 through 321-6 because conductive line 321-1 is associated with a physically closer TSV.

A conductive line associated with a closer TSV can be narrower than a conductive line associated with a TSV further from the current source. For example, conductive line 321-1 can have a narrower width than conductive lines 321-2 to 321-6, conductive line 321-2 can have a narrower width than conductive lines 321-3 to 321-6, conductive line 321-3 can have a narrower width than conductive lines 321-4 to 321-6, conductive line 321-4 can have a narrower width than conductive lines 321-5 to 321-6, and conductive line 321-5 can have a narrower width than conductive line 321-6. In the alternative, conductive line 321-6 can be referred to as having a wider width than conductive lines 321-1 to 321-5, and so forth.

A width and length of a conductive line can be associated with a resistance of the conductive line. A conductive line with a narrower width can have a greater resistance than a conductive line with a wider width. For example, conductive line 321-1 has a narrowest width but the shortest physical length because conductive line 321-1 is associated with a closest TSV 327-1 to the current source 334. Conductive line 321-1 would have a greater resistance in cross-sectional area, but less resistance over its physical length than conductive lines 321-2 to 321-6. Conductive line 321-6 would have less resistance in cross sectional area but the greatest resistance over its physical length than conductive lines 321-1 to 321-5. In this way, a current through a TSV can be varied based on a width and length of a conductive line associated with the TSV.

As described above, a TSV can decrease an operational lifetime if a current through the TSV exceeds a threshold (e.g., 13 mA). By varying a width of a conductive line associated with the TSV, a distribution of currents throughout a number of TSVs of a memory die can be varied to maintain each of the currents through each of the TSVs below a particular threshold (e.g., 13 mA). For example, when a width of each of the conductive lines are the same across a number of TSVs of a memory die (as illustrated and described in connection with FIG. 2), a closest TSV can have a much higher current than other TSVs having a greater physical distance from the current source. For example, current 215-1 in FIG. 2 can be 24 mA while current 215-2 can be 4.8 mA.

By varying a width of a conductive line associated with a TSV, current distribution can be maintained such that a more equal distribution of portions of current can be provided through each of the TSVs. In one example, conductive line 321-1 can be formed to a width and length such that for a given current source it is calculated that a current of 9.1 mA passes through TSV 327-1. In turn, more current is drawn through the TSVs further from the current source. That is, a width of conductive line 321-2 can be wider than conductive line 321-1 and narrower than conductive lines 321-3 to 331-6. Conductive line 321-2 associated with TSV 327-2 can be formed to a width and length such that for a given current source it is calculated that a current of 8.0 mA passes through TSV 327-2. A width of conductive line 321-3 can be wider than conductive lines 321-1 to 321-2 but narrower than conductive lines 321-4 to 321-6. Conductive line 321-3 can be formed to a width and length such that for a given current source it is calculated that a current of 11.6 mA pass through TSV 327-3. Likewise, conductive line 321-4 can be formed to be wider than conductive lines 321-1 to 321-3, conductive line 321-5 can be formed to be wider than conductive lines 321-1 to 321-4, and conductive line 321-6 can be formed to be wider than conductive lines 321-1 to 321-5, resulting in TSV 327-4 having a current of 1.2 mA, TSV 327-5 having a current of 0.1 mA, and TSV 327-6 having a current of 0.0 mA. In this way, each of the first three closest TSVs (TSVs 327-1 to 327-3) have an approximately equal current passing through them that are each below a particular threshold (e.g., 13 mA).

Figure 4:
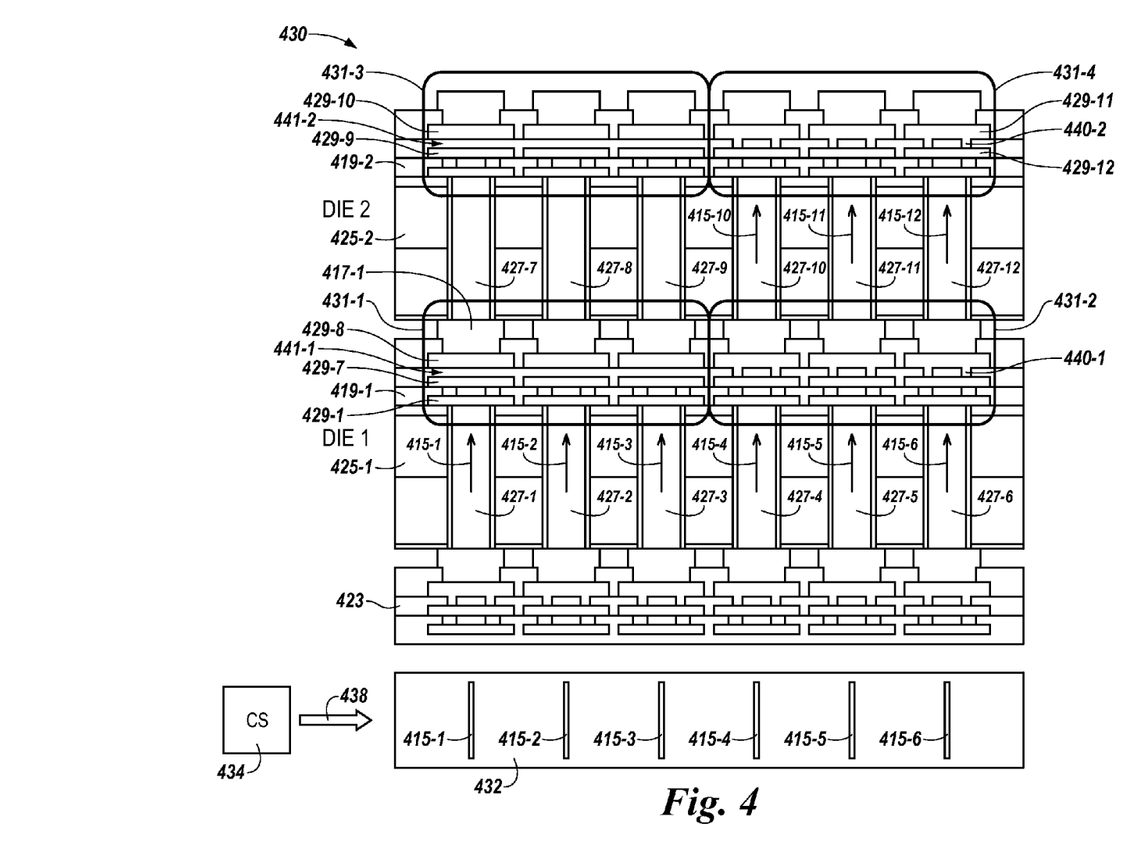
FIG. 4 is an example of a semiconductor device with modified current distribution in accordance with a number of embodiments of the present disclosure.

FIG. 4 is an example of an illustration of a semiconductor device 430 with modified current distribution in accordance with a number of embodiments of the present disclosure. Semiconductor device 430 includes a logic die (e.g., system on chip or SOC) 432, a first die (Die 1) 425-1, and a second die (Die 2) 425-2. Die 2 425-2 is stacked on-die 1 425-1. A number of interconnection contacts (e.g., conductive layers) connect logic die 432 and Die 1 425-1. Die 1 425-1 includes a number of through substrate (e.g., silicon) vias (TSVs)

427-1 to 427-6. TSVs 427-1 to 427-6 have a corresponding current 415-1 to 415-6. That is, TSV 427-1 has a current 415-1 traveling through TSV 427-1, TSV 427-2 has a current 415-2 through TSV 427-2, and so forth. A current source 434 provides, at 438, a total current to the logic die 432, which is coupled to Die 1 425-1 and sends the current from the current source 434 on through Die 1 425-1. Die 1 425-1 includes a number of interconnection contacts 419-1.

When an additional memory die (e.g., Die 2 425-2) is stacked on Die 1 425-1, total current is drawn to supply two memory dies instead of one. This can increase an amount of current passing through a TSV in a memory die (e.g., Die 1 425-1) closer in physical distance to a current source 434. That is, when an additional memory die is stacked above Die 1 425-1, TSV 427-1 can have a current of 18.2 mA, which is double the current on-die circuitry of a single memory die would draw, since there is an additional memory die drawing current. In likewise fashion, and assuming conductive lines of varying width as described in FIG. 3, TSV 427-2 can have a current of 16.0 mA, TSV 427-3 can have a current of 23.2 mA, TSV 427-4 can have a current of 1.2 mA, TSV 427-5 can have a current of 0.1 mA, and TSV 427-6 can have a current of 0 mA. In order to decrease a current below a particular threshold for each of the TSVs, a number of interconnection contacts can be disconnected and/or uncoupled in order to prevent current from reaching circuitry of a memory die (e.g., Die 2 425-2) further from a current source 434.

As mentioned above, Die 2 425-2 can be stacked on Die 1 425-1. Die 2 425-2 includes a number of TSVs 427-7 to 427-12. TSVs 427-10 to 427-12 each having a corresponding current 415-10 to 415-12, respectively, running through TSVs 427-10 to 427-12. Die 2 425-2 includes a number of interconnection contacts 419-2. TSVs 427-7 to 427-9 are not illustrated with a current as the current is not running through TSVs 427-7 to 427-9 due to interconnection contact 429-10 not being coupled to interconnection contact 429-9. As a reference, interconnection contact 429-1 can be a same interconnection contact as illustrated in FIG. 3 as interconnection contact 329-1. In the alternative, interconnection contact 329-1 can correspond to one of interconnection contacts 429-1, 429-7, and/or 429-8, depending on which interconnection contact is electrically coupled to the on-die circuitry. An electrical connection (e.g., solder bump, metallization bump, etc.) above interconnection contact 429-10 can be a same electrical connection as electrical connection 317-1 in FIG. 3.

A first set of interconnection contacts 431-1 of Die 1 425-1 represent interconnection contacts closer to current source 434, and corresponding to TSVs 427-1 to 427-3. A second set of interconnection contacts 431-2 of Die 1 424-1 represent interconnection contacts further from current source 434, and corresponding to TSVs 427-4 to 427-6. First set of interconnection contacts 431-1 have interconnections layers (e.g., interconnection contacts 429-7 and 429-8) that are not connected and/or uncoupled, as shown by arrow 441-1. Second set of interconnection contacts 431-2 have interconnection contacts connected and/or coupled, as illustrated by electrical connection 440-1.

A third set of interconnection contacts (e.g., conductive layers, metallization layers, etc.) 431-3 of Die 2 425-2 (consisting of interconnection contacts associated with TSVs 427-7 to 427-9) represent interconnection contacts closer to a current source 434, and corresponding to TSVs 427-7 to 427-9. A fourth set of interconnection contacts 431-4 of Die 2 425-2 represent interconnection contacts further from a current source 434, and corresponding to TSVs 427-10 to 427-12. Third set of interconnection contacts 431-3 includes at least two interconnection contacts (e.g., interconnection contacts 429-9 and 429-10) that are not connected and/or uncoupled, as shown by arrow 441-2, preventing current from traveling through TSVs 427-7 to 427-9. Fourth set of interconnection contacts 431-4 have interconnection contacts (e.g., interconnection contacts 429-11 and 429-12) connected and/or coupled, at electrical connection 440-2. As illustrated, currents 415-1 to 415-6 are drawn through TSVs 427-1 to 427-3, but current (e.g., what would be currents 415-7 to 415-9, not illustrated) does not run through TSVs 427-7 to 427-9 due to first set 431-1 and third set of interconnection contacts 431-2 being disconnected and/or uncoupled, as shown by arrows 441-1 and 441-2. Currents 415-4 to 415-6 run through corresponding TSVs 427-4 to 427-6 and currents 415-10 to 415-12 run through corresponding TSVs 427-10 to 417-12 due to second set 431-3 and fourth set of interconnection contacts 431-4 being connected and/or coupled, as shown by electrical connections 440-1 and 440-2.

The following description is an example current distribution of a stacked memory die using both varying widths of conduction lines between interconnection contacts and on-die circuitry (as described and illustrated in FIG. 3) and disconnection and/or uncoupling of interconnection contacts as described above in reference to FIG. 4. In this example, the TSVs 427-1 to 427-6 of Die 1 425-1 includes: TSV 427-1 with current 415-1 of 9.1 mA, TSV 427-2 with current 415-2 of 8.0 mA, TSV 427-3 with current 415-3 of 11.6 mA, TSV 427-4 with current 415-4 of 10.7 mA, TSV 427-5 with current 415-5 of 8.5 mA, and TSV 427-6 with current 415-6 of 12.1 mA. In this example, TSVs 427-7 to 427-12 of Die 2 425-2 includes: TSV 427-7 with current 0 mA (or at least negligible), TSV 427-8 with current 0 mA (or at least negligible), TSV 427-9 with current 0 mA (or at least negligible), TSV 427-10 with current 415-10 of 9.5 mA, TSV 427-11 with current 415-11 of 8.4 mA, and TSV 427-12 with current 415-12 of 12.1 mA. The previous example currents are further illustrated below in Table 1.

TABLE 1

| TSVs of Die 2 425-2 | 427-7 | 427-8 | 427-9 | 427-10 | 427-11 | 427-12 |
|---|---|---|---|---|---|---|
| Current (mA) | 0.0 | 0.0 | 0.0 | 9.5 | 8.4 | 12.1 |
| TSVs of Die 1 425-1 | 427-1 | 427-2 | 427-3 | 427-4 | 427-5 | 427-6 |
| Current (mA) | 9.1 | 8.0 | 11.6 | 10.7 | 8.5 | 12.1 |

As illustrated in Table 1, the total current distribution through TSVs 427-1 to 427-6 associated with and/or corresponding to Die 1 425-1 is 60 mA (9.1+8.0+11.6+10.7+8.5+12.1=60) and the total current distributed through TSVs 427-7 to 427-12 associated with and/or corresponding to Die 2 425-2 is 30 mA (9.5+8.4+12.1=30). As described above, when referring to an example distribution with one memory die using varying conductive line widths, a current distribution across six TSVs can include 9.1 mA, 8.0 mA, 11.6 mA, 1.2 mA, 0.1 mA, and 0 mA, respectively. In this example, a similar pattern with the stacked die above occurs except that an amount through TSVs 427-4, 427-5, and 427-6 include a current from each of the TSVs stacked above (e.g., TSV 427-10 above 427-4, 427-11 above 427-5, and 427-12 above 427-6). That is, 1.2 mA from an example of TSV 427-4 in a single stack arrangement is added to 9.5 mA of current drawn by TSV 427-10 in a stacked arrangement, resulting in a current of 10.7 mA (as illustrated in Table 1).

Therefore, by varying a width of a conductive line between an interconnection contact and an on-die circuit of a memory die can maintain a current through each TSV of a number of TSVs of a memory die below a particular threshold current. In addition, when stacking memory dies, disconnected and/or uncoupled interconnection contacts can provide current to TSVs in a memory die stacked above while maintaining current of the TSVs below the particular threshold.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor device, comprising:
    a logic die;
    a memory die in contact with the logic die and configured to draw a sum amount of current from a current source, wherein the memory die includes:
        a plurality of through-substrate vias (TSVs) formed in the memory die to provide the sum amount of current to the memory die from the current source, wherein each of the plurality of TSVs are configured to provide a portion of the sum amount of current to the memory die from the current source;
        at least two interconnection contacts associated with a first TSV closer to the current source that are not connected; and
        an electrical connection between at least two interconnection contacts associated with a second TSV that is further in distance from the current source than the first TSV.

2. The semiconductor device of claim 1, wherein a resistance between the at least two interconnection contacts associated with the first TSV is greater than a resistance of the electrical connection.

3. The semiconductor device of claim 1, wherein the sum amount of current is provided to on-die circuitry through a power bus.

4. The semiconductor device of claim 1, wherein:
    the sum amount of current drawn by the memory die is divided among the plurality of TSVs; and
    conductive lines formed according to a semiconductor process are sized and connected to maintain a current through each of the plurality of TSVs under a particular threshold current.

5. The semiconductor device of claim 4, wherein the particular threshold current is less than 13 mA current.

6. The semiconductor device of claim 1, wherein the first TSV is coupled to on-die circuitry via interconnection contacts.

7. The semiconductor device of claim 1, wherein an additional memory die is stacked on the memory die, wherein an additional plurality of TSVs extend through the additional memory die and align to at least a portion of the plurality of TSVs that extend through the memory die.

8. The semiconductor device of claim 7, wherein:
    at least two interconnection contacts associated with a first set of interconnection contacts associated with a first set of TSVs of the plurality of TSVs and a second set of interconnection contacts associated with a second set of TSVs of the additional plurality of TSVs that are a closer physical distance to the current source are not connected; and
    a third set of interconnection contacts associated with a third set of TSVs of the plurality of TSVs and a fourth set of interconnection contacts associated with a fourth set of TSVs of the additional plurality of TSVs are a further distance from the current source than the first set are connected.

9. The semiconductor device of claim 8, wherein a width of an electrical connection between a TSV of the additional plurality of TSVs is narrower than a TSV further from the current source.

10. A semiconductor device comprising:
    a logic die;
    a memory die in contact with the logic die and configured to draw an amount of current from a current source; and
    a plurality of through-substrate vias (TSVs) formed in the memory die and configured to provide the amount of current to the memory die from the current source;
    a first conductive line between:
        a first TSV having a first distance to the current source and associated with the plurality of TSVs; and
        a circuit of the memory die;
    wherein the first conductive line has a narrower width than a second conductive line connecting to a second TSV a further physical distance from the current source.

11. The semiconductor device of claim 10, wherein a width of a conductive line of the plurality of TSVs is dependent on a distance in relation to the current source.

12. The semiconductor device of claim 11, wherein a width of a conductive line of a TSV of the plurality of TSVs increases as a distance from the current source increases.

13. The semiconductor device of claim 10, wherein a length and a width of the first conductive line is fabricated such that a resistance of the first conductive line is equivalent to a resistance of the second conductive line.

14. The semiconductor device of claim 10, wherein a portion of the amount of current through each of the plurality of TSVs is less than 13 mA.

15. The semiconductor device of claim 10, wherein:
    the first TSV is closest to the current source; and
    the second TSV is second closest to the current source;
    wherein:
        the first conductive line has a narrowest width; and
        the second conductive line has a second narrowest width.

16. The semiconductor device of claim 15, wherein:
a third TSV of the plurality of TSVs is third closest to the current source;
a fourth TSV is fourth closest to the current source;
a fifth TSV is fifth closest to the current source; and
a sixth TSV is sixth closest;
wherein:
   a conductive line of the third TSV has a third narrowest width;
   a conductive line of the fourth TSV has a fourth narrowest width;
   a conductive line of the fifth TSV has a fifth narrowest width; and
   a conductive line of the sixth TSV has a sixth narrowest width.

17. A method of forming a semiconductor device, comprising:
forming at least two interconnection contacts associated with a first through substrate via (TSV) closer to a current source that are not connected; and
forming an electrical connection between at least two interconnection contacts associated with a second TSV further from the current source than the first TSV.

18. The method of claim 17, wherein the at least two interconnection contacts associated with the first TSV have greater resistance between the at least two interconnection contacts than the electrical connection between the at least two interconnection contacts associated with the second TSV.

19. The method of claim 17, wherein:
the first TSV and the second TSV are associated with a memory die stacked on top of a lower memory die; and
the memory die is further from the current source than the lower memory die.

20. The method of claim 19, wherein interconnection contacts associated with a third TSV that provides current to the first TSV and is associated with the lower memory die are aligned and interconnected.

21. A method of forming a semiconductor device, comprising:
forming a first conductive line between a first through substrate via (TSV) and circuitry of a memory die that couples the first TSV and the circuitry, wherein the first conductive line is a first width; and
forming a second conductive line between a second TSV and the circuitry that couples the second TSV and the circuitry, wherein the second conductive line is a second width; and
connecting a current source to the first TSV and the second TSV;
wherein:
   the first TSV is closer to the current source than the second TSV; and
   the first width is narrower than the second width.

22. The method of claim 21, comprising a plurality of TSVs within the memory die to provide a total amount of current from the current source to the memory die through the plurality of TSVs.

23. The method of claim 22, comprising forming a plurality of conductive lines between each of the plurality of TSVs and the circuitry, wherein a width of each of the plurality of conductive lines is formed based on a distance from the current source.

24. The method of claim 23, wherein a width associated with a conductive line is formed more narrow when closer to the current source and wider when further from the current source.

25. The method of claim 21, comprising:
stacking an additional memory die on top of the memory die;
forming a first set of interconnection contacts associated with a third TSV of the additional memory die that is closer to the current source than the first TSV and the second TSV.

26. The method of claim 25, wherein the first set of interconnection contacts are formed without connecting at least two interconnection contacts of the first set of interconnection contacts.

27. The method of claim 26, comprising forming a second set of interconnection contacts associated with a fourth TSV of the additional memory die with electrical connections between the second set of interconnection contacts.

28. A semiconductor device, comprising:
a logic die;
a plurality of stacked memory dies in contact with the logic die;
through-substrate vias (TSVs) through each of the plurality of stacked memory dies;
interconnection contacts between each of the plurality of stacked memory dies; and
conductive lines coupling each TSV of the TSVs to on-die circuitry;
wherein:
   a width of a conductive line to each of the TSVs and the on-die circuitry varies based on a distance of each of the TSVs from a current source;
   at least two interconnection contacts between die associated with a TSV closer to the current source than another TSV are not electrically connected; and
   interconnection contacts between die associated with the another TSV are electrically connected.

29. The semiconductor device of claim 28, wherein the width of each of the conductive lines is narrower when associated with a TSV closer to the current source than a TSV further away from the current source.

30. The semiconductor device of claim 28, wherein a portion of a total amount of current from the current source through each of the TSVs is below a threshold current and varies based on the corresponding width of each of the conductive lines.

* * * * *